US012313676B1

(12) United States Patent
Tsironis

(10) Patent No.: US 12,313,676 B1
(45) Date of Patent: May 27, 2025

(54) PLANARITY CONTROL FOR LOAD PULL TUNER ON WAFER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 18/646,174

(22) Filed: Apr. 25, 2024

Related U.S. Application Data

(62) Division of application No. 17/826,838, filed on May 27, 2022.

(51) Int. Cl.
*G01R 31/28* (2006.01)
*G01R 1/067* (2006.01)

(52) U.S. Cl.
CPC ..... *G01R 31/2891* (2013.01); *G01R 1/06772* (2013.01)

(58) Field of Classification Search
CPC ............ G01R 31/2891; G01R 1/06772
See application file for complete search history.

(56) References Cited

U.S. PATENT DOCUMENTS

| | | | | |
|---|---|---|---|---|
| 5,345,170 A * | 9/1994 | Schwindt | ............ | G01R 1/0416 324/750.19 |
| 9,335,345 B1 | 5/2016 | Tsironis | | |
| 9,653,332 B1 | 5/2017 | Tsironis | | |
| 10,637,122 B1 * | 4/2020 | Tsironis | ............ | H03J 1/06 |
| 10,686,239 B1 | 6/2020 | Tsironis | | |
| 11,125,777 B1 * | 9/2021 | Tsironis | ............ | G01R 27/06 |
| 11,327,101 B1 * | 5/2022 | Tsironis | ............ | G01R 27/32 |
| 11,402,424 B1 * | 8/2022 | Tsironis | ............ | H01P 5/04 |
| 11,480,589 B1 * | 10/2022 | Tsironis | ............ | G01R 1/06788 |
| 11,598,790 B1 * | 3/2023 | Tsironis | ............ | G01R 1/06772 |

OTHER PUBLICATIONS

"Load Pull" [online] Wikipedia, [Retrieved on Aug. 24, 2017]. Retrieved from Internet <URL: https://en.wikipedia.org/wiki/Load_pull>, 2 pages.
"Computer Controlled Microwave Tuner, CCMT", Product Note 41, Focus Microwaves Inc. 1998, pp. 2-4, 20 pages.
"On Wafer Load Pull Tuner Setups: A Design Help", Application Note 48, Focus Microwaves, Dec. 2001, p. 2 ff., Figure 2, 15 pages.
"ACP40-GSG-xxx Probes", Brochure PN 153-231-B [online], FormFactor [Retrieved on Apr. 14, 2021]. Retrieved from Internet <URL:https://formfactor.com /download/acp-quick-guide/?/wpdmdl=3524&refresh=60764fb91b8a31618366393)>, 2018, 4 pages.
Load Pull Characterization, White Paper #64, Focus Microwaves Inc., Chapter 2, pp. 13-15, Chapter 9, pp. 43-49, 56 pages, 2019.

* cited by examiner

*Primary Examiner* — Paresh Patel

(57) ABSTRACT

Planarity adjustment of RF microprobes in a load pull setup on wafer, using a low-profile impedance tuner that is mounted on a 3-axis tuner positioner at an angle matching approximately the angle of the wafer probe, is performed using a wedge-shaped interface block and a gimbal linking the vertical axis of the 3-axis tuner positioner with the tuner body. The gimbal is required when the axis of the slabline is not aligned with the tips of the RF microprobes, in which case the tuner rotates on a planetary trajectory around the rotation axis of the probe tips. The amplitude of the rotation does not exceed ±5° and can be absorbed using flexible RF cables between the tuner and auxiliary equipment.

2 Claims, 11 Drawing Sheets

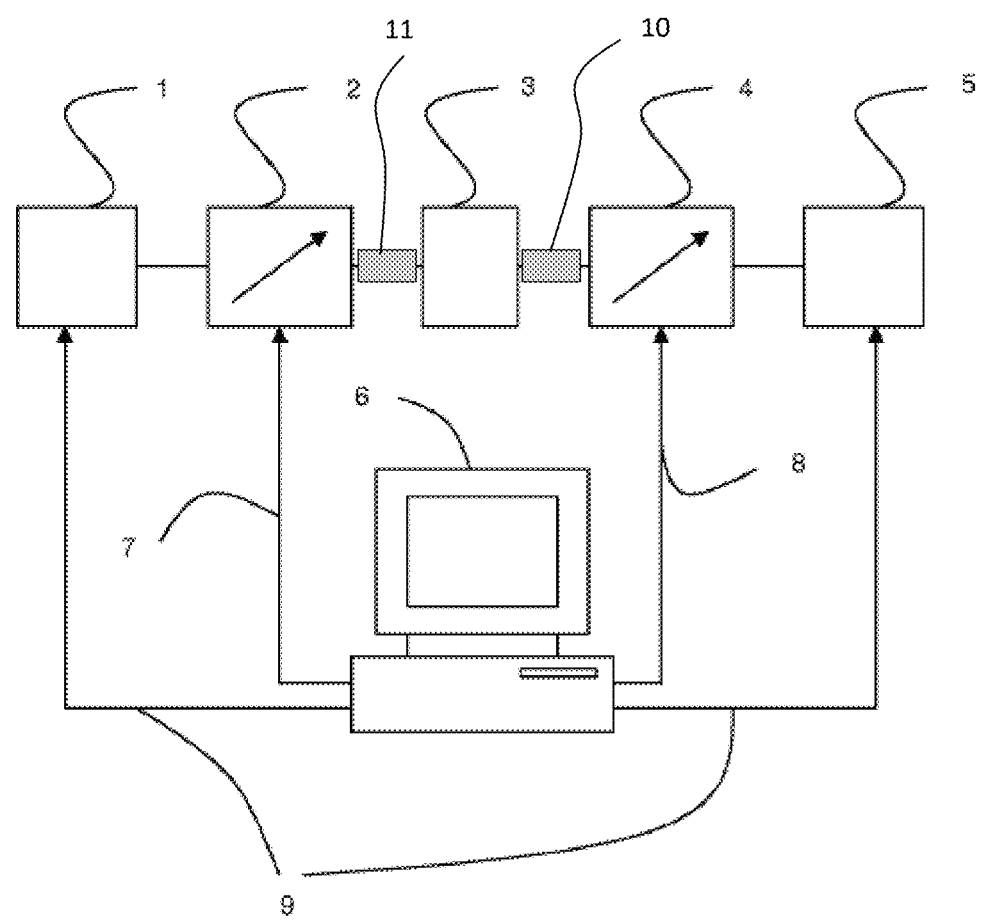
FIG. 1: Prior art

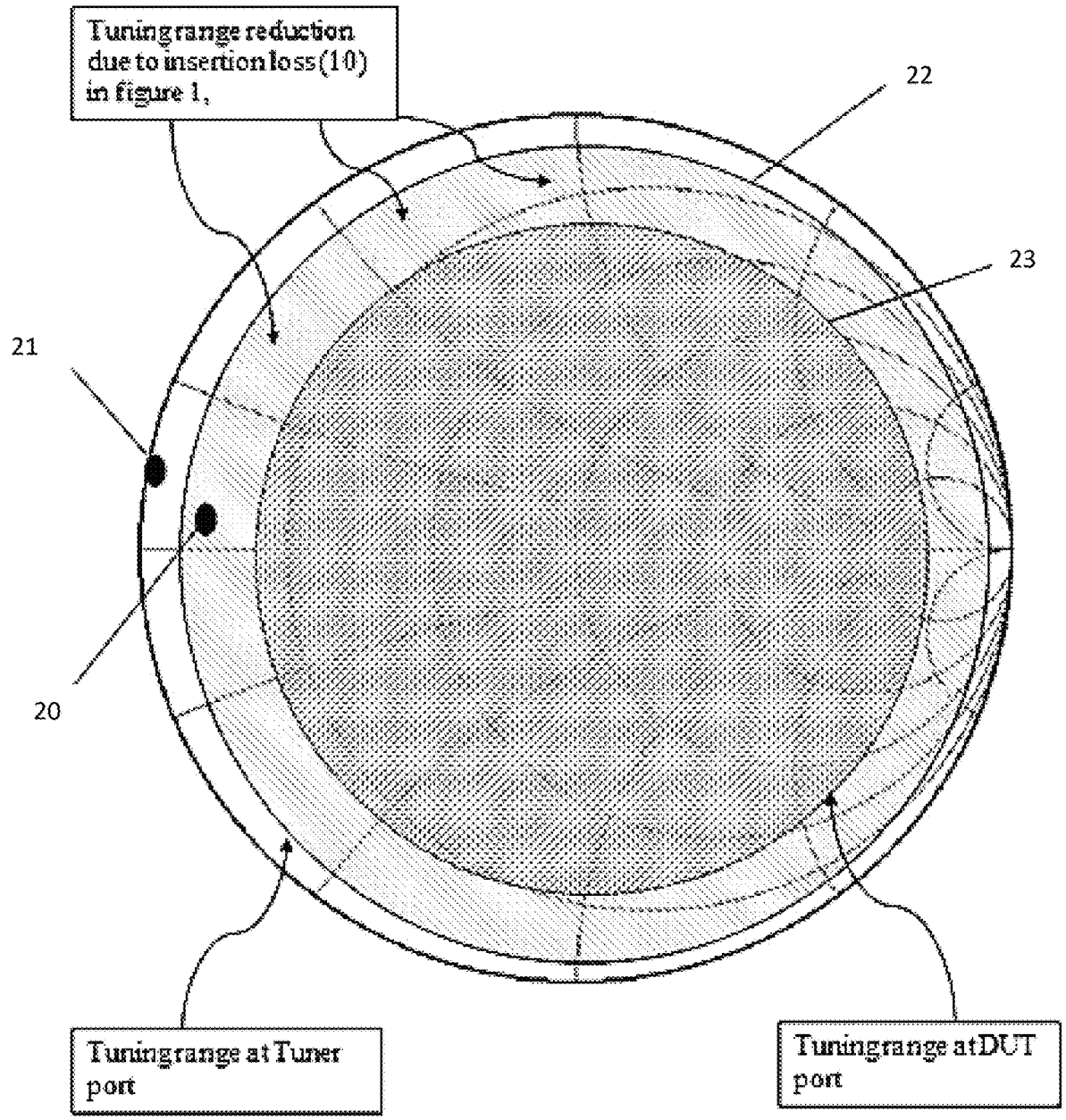
FIG. 2: Prior art

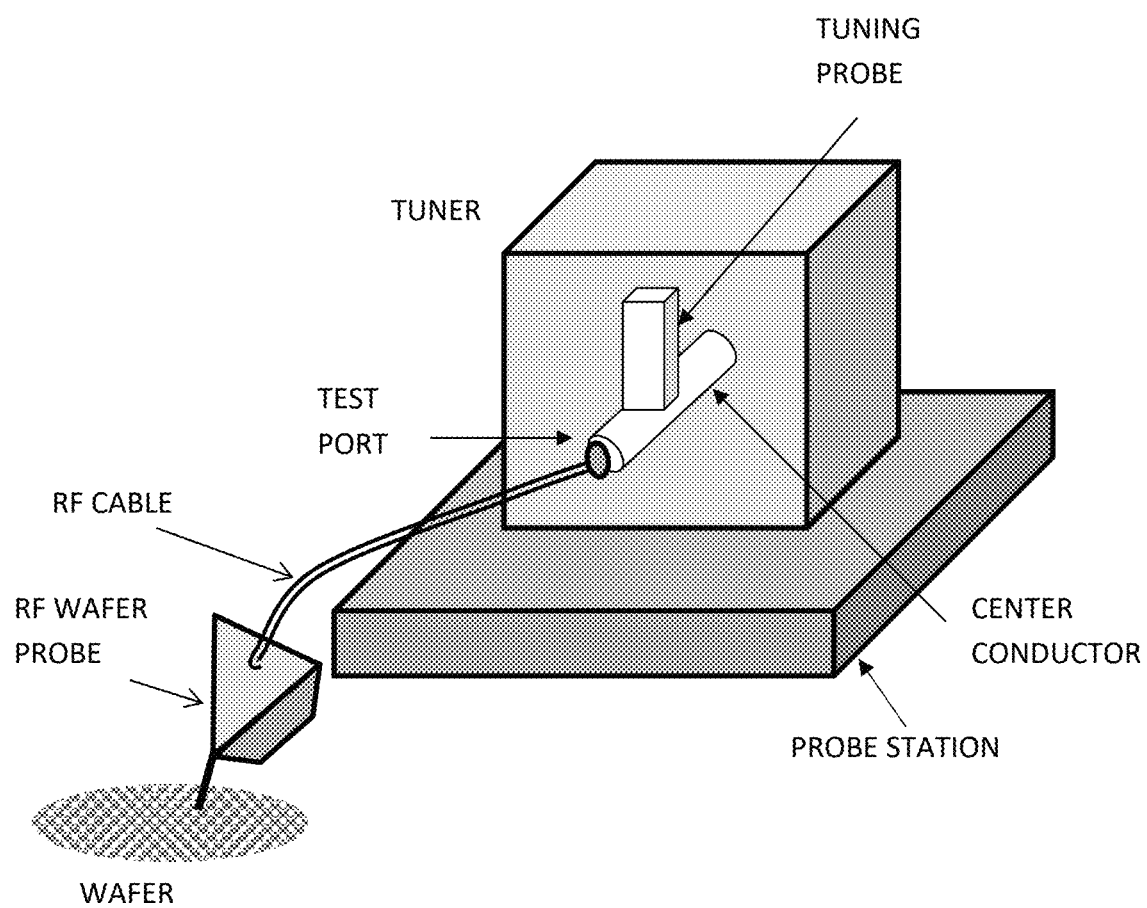
FIG. 3: Prior art

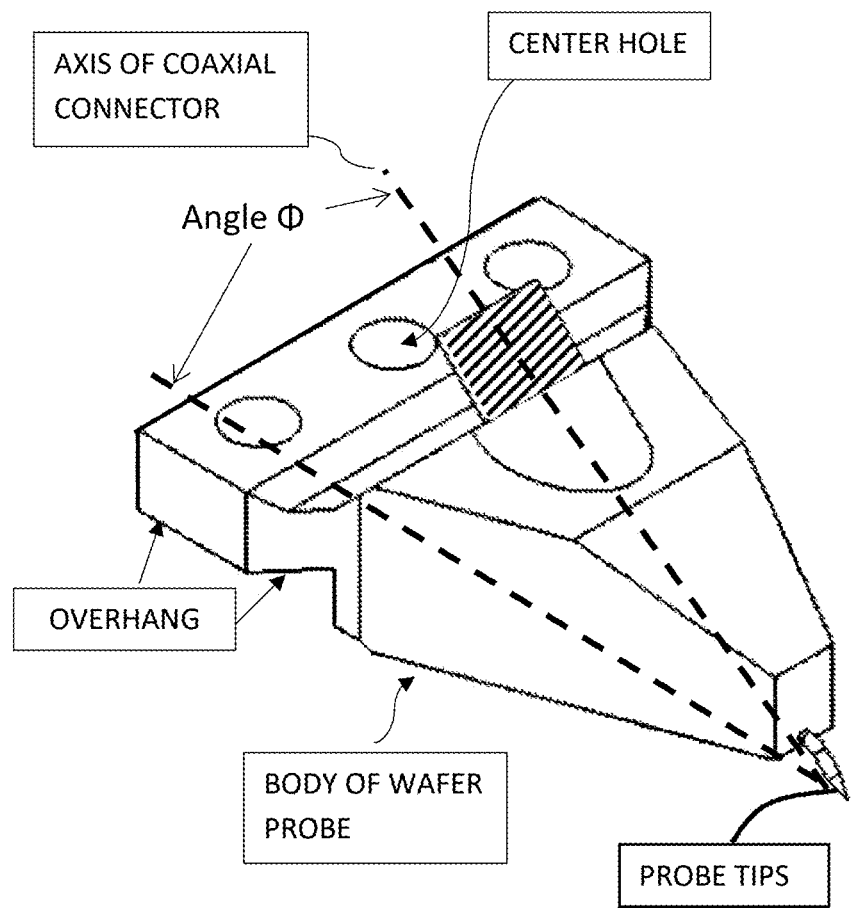
FIG. 4: Prior art

FIG. 5A: Prior art
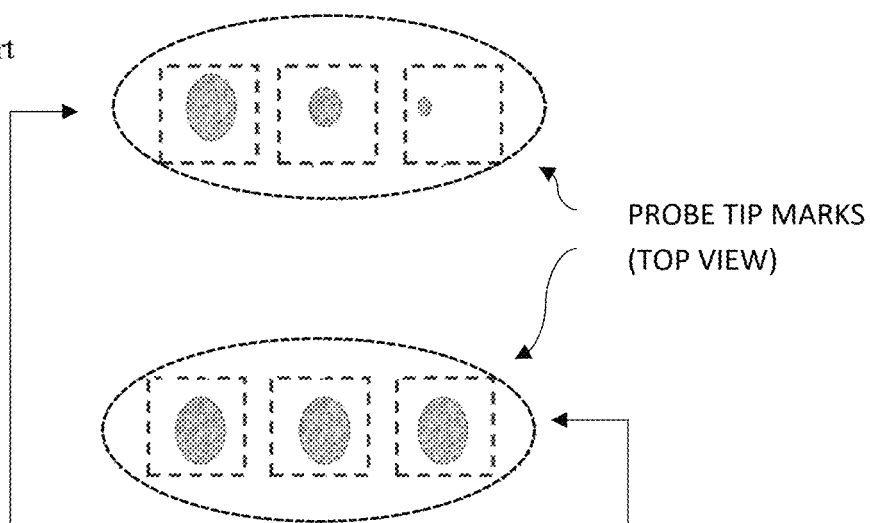
PROBE TIP MARKS (TOP VIEW)
FIG. 5B: Prior art
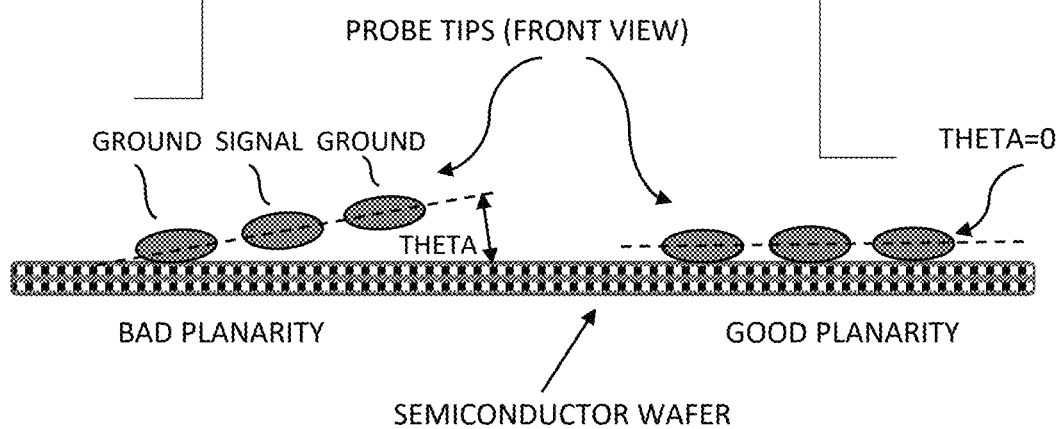
PROBE TIPS (FRONT VIEW)
GROUND  SIGNAL  GROUND
THETA
THETA=0
BAD PLANARITY
GOOD PLANARITY
SEMICONDUCTOR WAFER

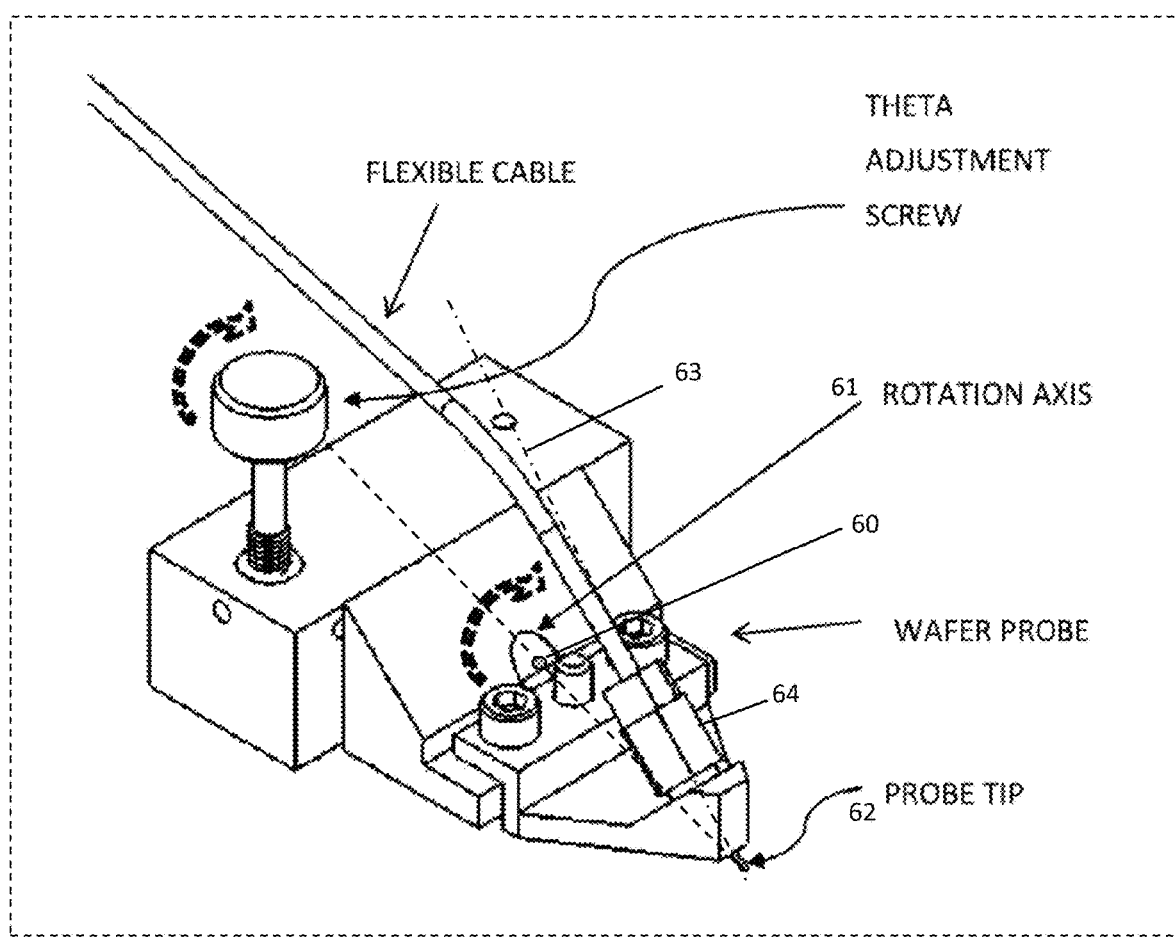
FIG. 6: Prior art

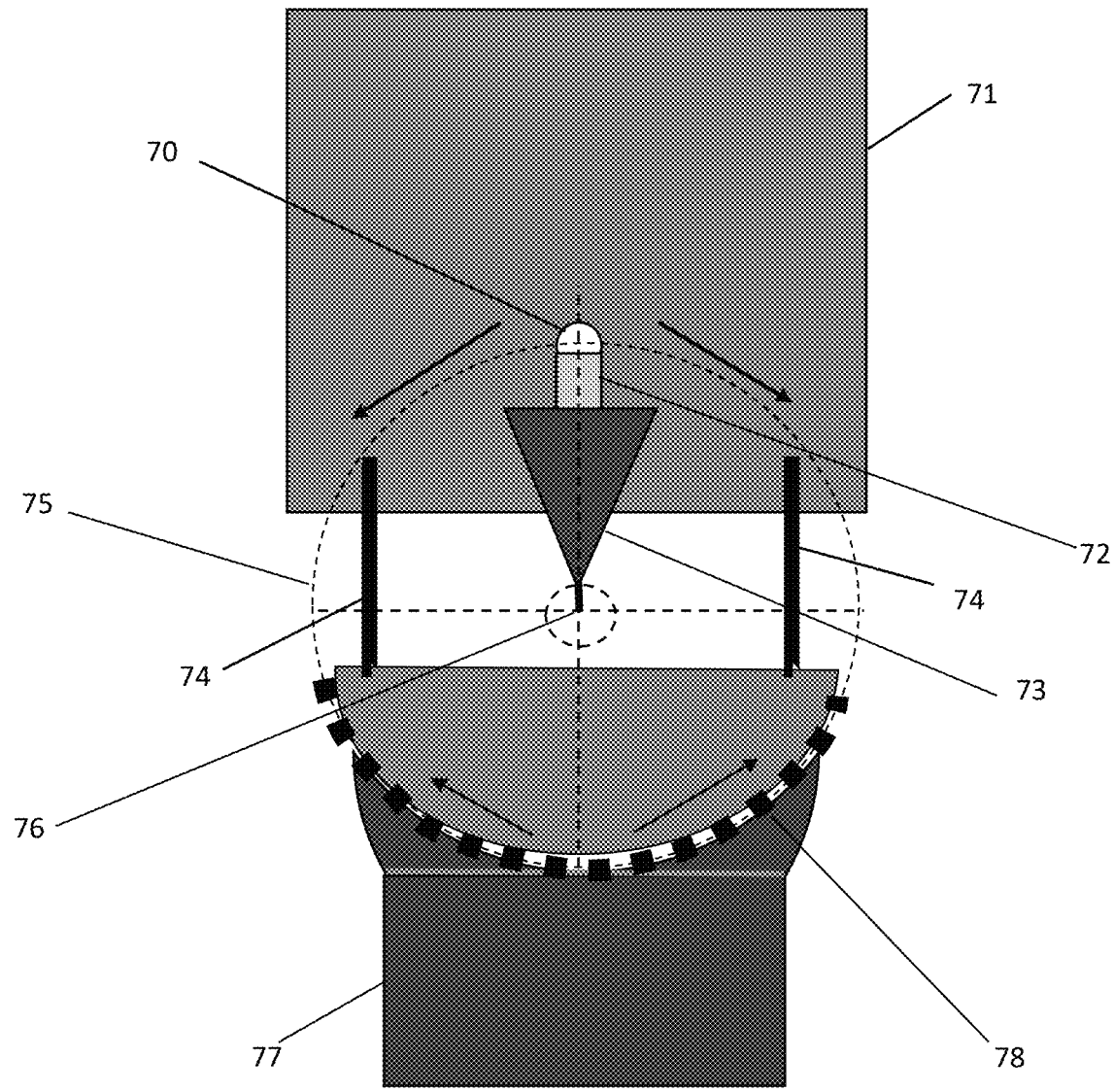
FIG. 7: Prior art

PLANARITY CONTROL FOR LOAD PULL TUNER ON WAFER

PRIORITY CLAIM

The application is a divisional application to Ser. No. 17/826,838, filed on May 27, 2022, titled "Planarity Control for Load Pull Tuner On Wafer", which is hereby enclosed in its entirety for reference purposes.

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "On Wafer Load Pull Tuner Setups: A Design Help", Application Note 48, Focus Microwaves, December 2001, page 2 ff., FIG. 2.
4. "ACP40-GSG-xxx Probes", Brochure PN 153-231-B [online], FormFactor [Retrieved on 2021 Apr. 14]. Retrieved from Internet <URL: https://formfactor.com/download/acp-quick-guide/?/wpdmdl=3524&refresh=60764fb91b8a31618366393)>.
5. Load Pull Characterization, White Paper #64, Focus Microwaves Inc., Chapter 2, pp. 13-15, Chapter 9, pp. 43-49.
6. Tsironis, C. U.S. Pat. No. 10,686,239, "Slide screw tuners with offset tuning probes and method", FIGS. 10, 12.
7. Tsironis, C. U.S. Pat. No. 9,335,345, "A Method for Planarity Alignment of Waveguide Wafer Probes".
8. Tsironis, C. U.S. Pat. No. 9,653,332, "Wafer probe holder for planarity and orientation adjustment", FIGS. 3 and 8.

BACKGROUND OF THE INVENTION

This invention relates to load and source pull testing (see ref. 1) of low noise and medium and high-power RF transistor and amplifiers chips on semiconductor wafers also using remotely controlled electro-mechanical impedance tuners (see ref. 2).

Modern design of low noise and high-power RF amplifiers used in various communication systems, requires accurate knowledge of the active device's (transistor's) characteristics. In such circuits, it is insufficient for the transistors, which operate in their low noise or highly non-linear regime, close to power saturation, to be described using noise or non-linear numeric models only.

A popular method for testing and characterizing such high-power microwave and millimeter-wave transistors (DUT, device under test) is "load pull" (FIG. 1). Low noise transistors are tested using "source pull". Load or source pull are measurement techniques employing impedance tuners 2, 4 and other test equipment, such as signal or noise sources 1, test fixtures for housing a DUT 3, and power meters or low noise receivers 5 to measure the extracted signal power, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner under which the DUT is tested (see ref. 1); impedance tuners allow determining the optimum impedance conditions for designing amplifiers and other microwave components for specific performance targets, such as noise parameters, gain, efficiency, inter-modulation etc., for chip devices on-wafer (see ref. 3). To connect the test equipment with the on-wafer chips one uses wafer micro-probes (FIG. 6). They comprise a holding body and a coaxial connector 64 giving access to the probe tips 62; to planarize the probe tips (FIG. 5B), the holding body has an inclined rotation axis 60-61, in line with the probe tips 62; this may be different than the orientation of the axis 63 of the coaxial connector 64. To planarize the probe tips 62 the whole body of the probe and the holder must be rotated; this is only possible if a flexible (and lossy) cable is used.

The insertion loss of the link between tuner and DUT (in wafer testing the DUT are accessed using wafer probes (see ref. 4), reduces 23 dramatically the intrinsic 22 tuning range of the system not allowing reaching optimum matching conditions 21, 20 (FIG. 2). To minimize this insertion loss 10, 11 the RF cable (FIG. 1) must be eliminated by reducing the tuner profile and connecting the tuner test port directly to the wafer probe (FIG. 8). However, the wafer probe must be aligned (FIGS. 5A and 5B) by rotating the wafer probe and the attached tuner and adjusting the angle Theta (Θ) to zero (see ref. 8).

BRIEF SUMMARY OF THE INVENTION

The invention consists in integrating a low-profile load pull impedance tuner with a RF wafer microprobe and align the planarity of the wafer probe (FIG. 5B) using a simple mechanism. Prior art, used when the tuner test port 70 is far from the wafer probe 73 employs either a flexible cable and a local rotation mechanism (FIG. 4) or a cumbersome ambitious rotation mechanism 77, rotating the whole tuner body 71 (FIG. 7) on an arc around a center 76; in this invention the offset distance between the probe tip plan and the rotation axis of the tuner is kept to a minimum (FIGS. 8 to 11) allowing for a simple and compact solution.

BRIEF DESCRIPTION OF THE SEVERAL VIEWS OF THE DRAWINGS

The invention and its mode of operation will be more clearly understood from the following detailed description, when read with the appended drawings in which:

FIG. 1 depicts prior art, a typical automated transistor source and load pull test system.

FIG. 2 depicts prior art, effect of insertion loss between tuner and DUT on reducing the tuning range at DUT reference plane.

FIG. 3 depicts prior art, schematic view of RF wafer microprobe connected with a load pull tuner using a RF cable and associated items.

FIG. 4 depicts prior art, a perspective view of a commercially available RF wafer microprobe.

FIG. 5A through 5B depict prior art: a magnified view of the tips of a wafer microprobe as a function of planarity status; FIG. 5A depicts the probe tip marks on the chip connection pads; FIG. 5B depicts a front view of the probe tips and definition of planarity angle THETA.

FIG. 6 depicts prior art, commercially available microprobe holder with THETA control and RF cable. The rotation axis is tilted to allow rotation of the probe tips without traversal movement.

FIG. 7 depicts prior art, a probe planarity adjustment mechanism using a section of a large circular bearing allowing to tilt the entire tuner around the probe tips.

DETAILED DESCRIPTION OF THE INVENTION

The load pull system (FIG. 1) requires at least one impedance tuner 4 or 2 to be connected to the DUT 3 in order to manipulate the source and/or load impedance. The (typical chip) DUT is accessible through wafer-probes (FIG. 4). The wafer probes have a coaxial connector leading directly and at minimum insertion loss, using (internally) short, microscopic (1 mm) coplanar waveguide or coaxial cable, to coplanar probe tips (FIG. 5). The angle Φ between the axis of the coaxial connector and the bottom plane of the body of the wafer probe is a characteristic quantity of the probe. There are wafer probes with Φ equal 30, 45 or 90 degrees (see ref. 4); this invention deals with 30- and 45-degree probes, to be able to tilt the tuners to match the probe axis.

Figure 8:
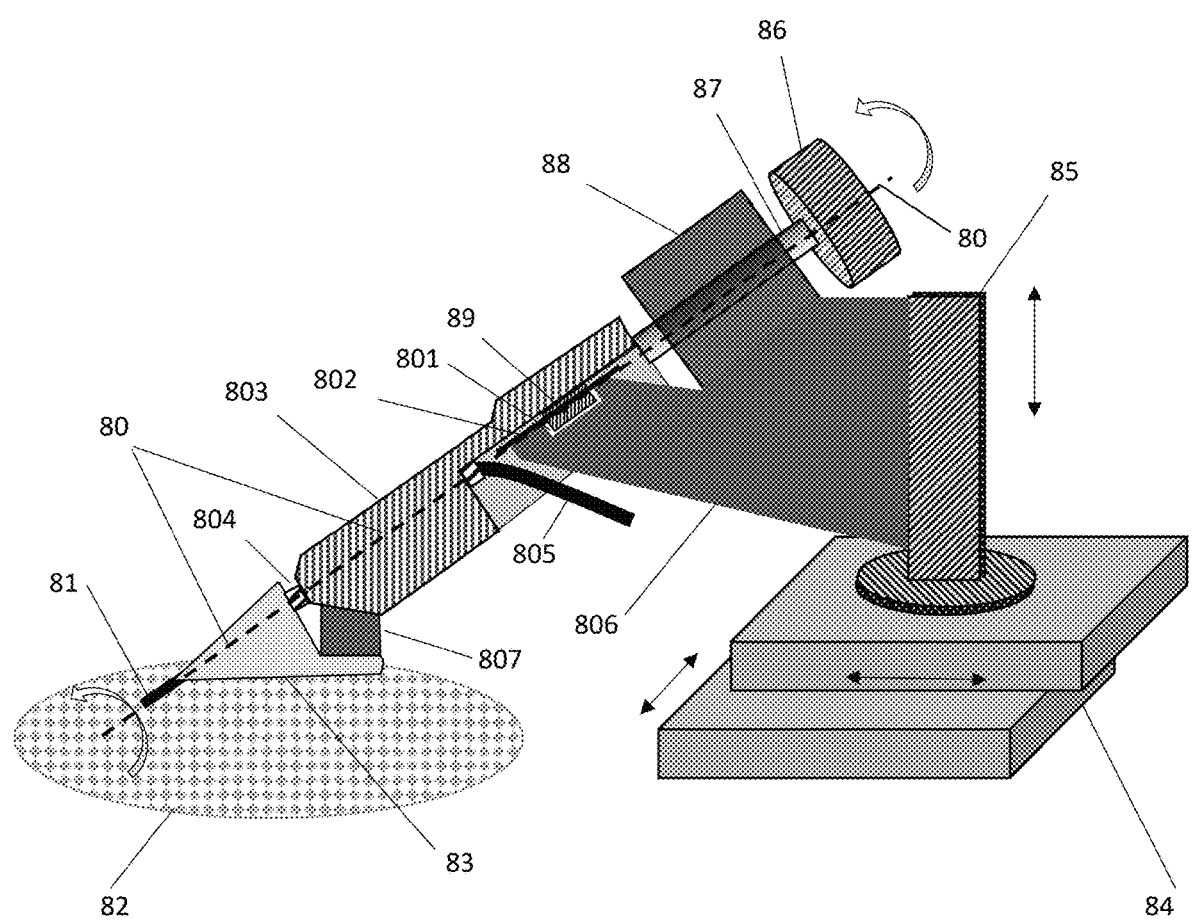
FIG. 8 depicts a planarity control mechanism for an assembly including a low-profile tuner attached to an RF microprobe, when the probe tips, the probe coaxial connector and the slabline center conductor are aligned on the same axis (they form a straight line).
Figure 9:
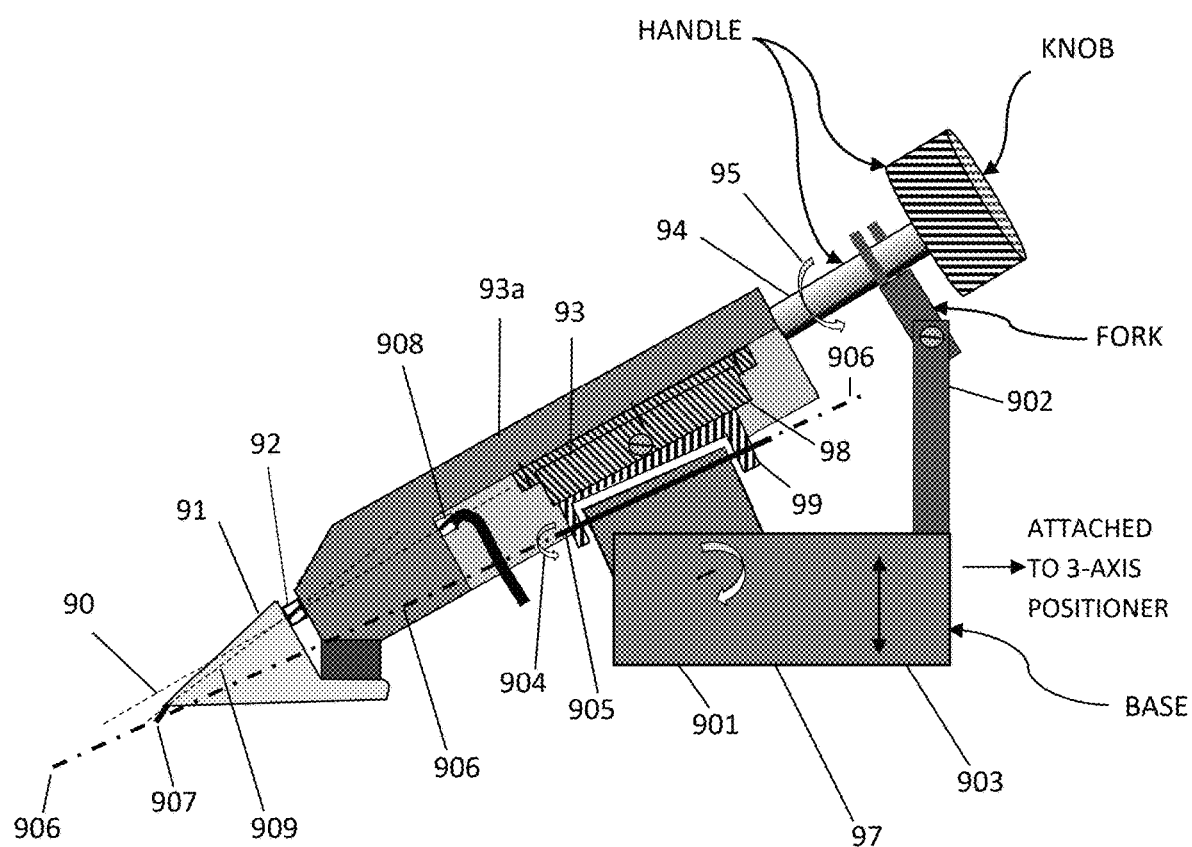
FIG. 9 depicts a planarity control mechanism for an assembly including a low-profile tuner attached to an RF microprobe, when the probe tips, the probe coaxial connector and the slabline center conductor are on different axes (they form a triangle).

Insertion loss 10, 11 of the connection paths between the tuners 4, 2 and the DUT 3 (FIG. 1) reduce the tuning range 22 at the tuner reference plane to the effective tuning range 23 at the DUT reference plane. The result is that a typical internal impedance 20 of the DUT cannot be conjugate matched, except if the insertion loss 10, 11 is minimized and the tuning range 23 is expanded towards the tuning range 22. In extreme cases, DUT with internal impedance 21 close to the limit of the Smith chart cannot be matched at all using passive tuners, instead requiring active tuning (see ref. 5). To reach tuning range close to 22 one has to minimize all insertion loss 10, 11 and place the internal tuning probe of the tuner as close to the tuner test port as possible. This is shown in FIGS. 8 and 9.

Figure 10:
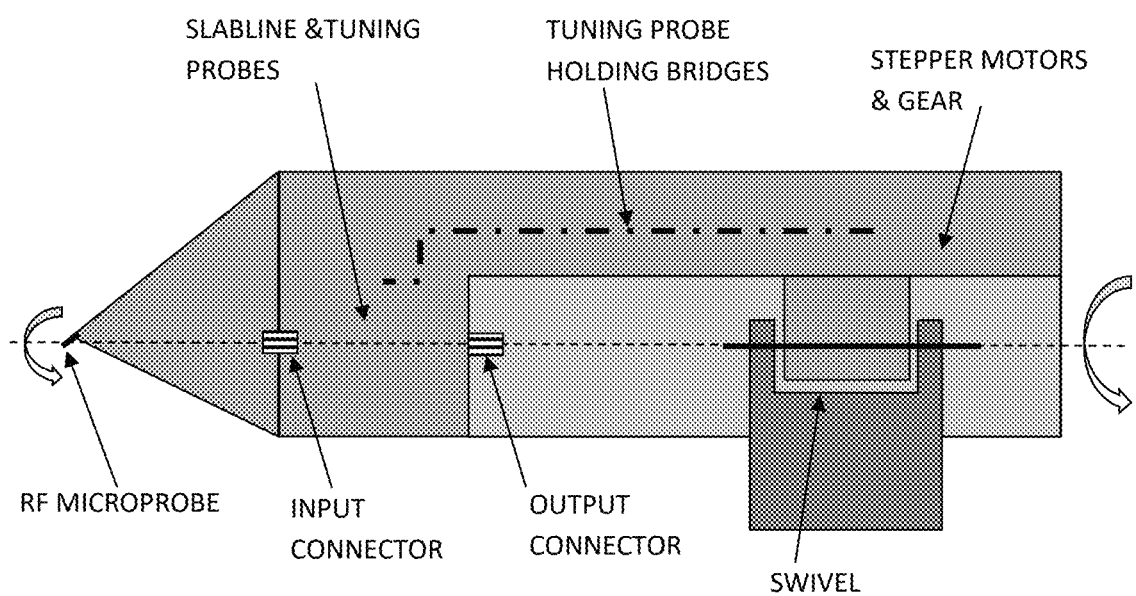
FIG. 10 depicts schematic view of a low-profile tuner where the RF microprobe tips are aligned with the slabline and the output coaxial connector, as in FIG. 8, the rotation performed by a simple swivel mechanism.
Figure 11:
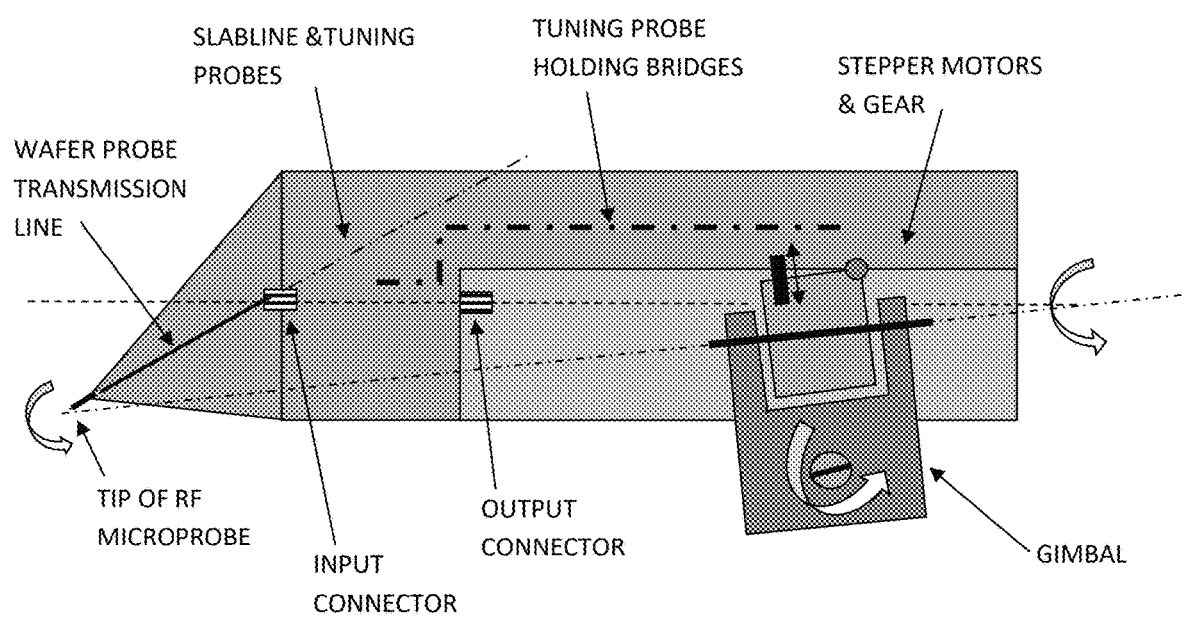
FIG. 11 depicts schematic view of a low-profile tuner where the RF microprobe tips are mis-aligned relative to the slabline and the output coaxial connector, as in FIG. 9, the rotation performed by a more complex gimbal mechanism.

FIGS. 10 and 11 depict the conceptual layout of a prior art low-profile tuner of ref. 6: In this case the tuning probes are held by an extension bracket and brought as close to the test port connector 804, 92 of the tuners as mechanically possible. For this the tuner slotted airline (slabline, see ref. 6), including the center conductor, is mounted externally to the tuner control structure protruding towards the DUT. This way the linear insertion loss inside the tuner, between the tuning probe and the test port is significantly reduced.

In hitherto art (FIG. 12 of ref. 6) the wafer probe was connected to the tuner by simply screwing and tightening the coaxial connector of the RF microprobe to the tuner test port adapter and aligned using some supporting alignment tool (FIGS. 5 and 7 in ref. 7) to planarize (adjust the angle THETA) the wafer probes, as shown in FIGS. 5A and 5B. This planarity adjustment method in is obviously based on personal feeling, experience and trial and error, since tightening the connectors by hand may change the angle THETA.

The correct approach should be to adjust and fix the planarity of the wafer-probe base after tightening the test port connector.

The usual prior art method, applicable to boxy tuner housings like the one shown in FIG. 3 is shown in FIG. 7: the problem to solve is how to rotate the whole tuner body 71 around a center 76 located at the tips of the RF microprobe. The whole assembly must rotate on a trajectory 75 (a circle) with the entire tuner body 71 tilting around a virtual center 76; this can only be done using a support 77 with a circular concave surface 78 equipped with a roller bearing chain holding the tuner using sturdy fully balanced struts 74. In this case the coaxial connector 70 of the tuner is also moving on an arc 75 and so does the connection 72 to the RF microprobe 73 and any equipment attached to it at the (not shown) idle port of the tuner.

The solution proposed in this invention is shown in two basic embodiments in FIGS. 8 and 9: In both cases the tuners used are low profile, as can be seen schematically in FIGS. 10 and 11, suitable to be connected directly and support the RF microprobes 83. In FIGS. 8 and 10 the tips 81 of the RF microprobe 83 connecting with the wafer 82 are aligned 80 with the probe connector 804, the slabline (not shown) of the tuner and the output connector, which is connected to a flexible RF cable 805. A swivel comprising a block 89 attached to the tuner body 803 is traversed by a shaft 802 which is placed in line with the axis 80 and rotates 801 versus the bracket 806. This allows the tuner body 803, which holds the RF wafer microprobe using the support block 807, to be anchored to the bracket 806 which is attached to the vertical axis 85 of the 3-axis tuner positioner 84. The bracket 806 has an extension 88, which is traversed by a secured stab 87 and can be rotated by a wheel 86, which ultimately controls the angle THETA (FIG. 5B) of the probe tips 81.

In the embodiment of FIG. 9 the axis 909 between the probe tips 907 and the connector 92 is not aligned with the coaxial connector 92 of the RF microprobe 91 and the slabline (not shown but connecting the test port 92 and the idle port 908 following the axis 90) of the tuner. This means a swivel like item 89 in the embodiment of FIG. 8 is inadequate in controlling simultaneously the rotation 95 and the tilting 97 around an unpredictable axis 906 through the probe tips 907 rotating 904 around this axis. A different mechanism, with an additional degree of adjustability, in form of a gimbal assembly comprising the socket 93 and 98, the first swivel 99, the rotation hinge 905, the second swivel 901 and the bracket 903, allowing tilting 97 the rotation axis 906 itself of the tuner body 93a to align with the probe tip's 907 rotation, must be used. It is understood that the support 903 of the gimbal is connected with the control shaft 94 supported using an adjustable stab 902 connected to a Y shaped fork at the top end to grip and guide the shaft 94 and is attached to a similar knob as item 88 in FIG. 8.

The principle of the two embodiments is shown conceptually in FIGS. 10 and 11; the low-profile tuner has, in both cases, a control area, housing stepper motors and control gear, like vertical axis and lead screws, a setoff bridges transferring the movement to the tuning probes, which are inserted into the slabline, which protrudes from the tuner body, in order to connect directly to the RF microprobes thus eliminating the insertion loss, which limits the tuning range (FIGS. 1 and 2). The swivel in FIG. 10 rotates around the axis through the probe tips, the slabline and the two input and output) tuner connectors. In the case of FIG. 11, the prolongation of the internal RF microprobe transmission line from the probe tips to the input connector of the tuner diverges from the axis between the input and output connector. It is therefore meaningless to rotate the tuner around the input-output axis, as in FIG. 10. The whole rotation axis must be tilted, which is possible, if, instead of a swivel we use a gimbal which allows a tilted rotation axis around the probe tips. The gimbal itself, as well as the swivel, are then, obviously, mounted on a bracket, fixed on the vertical axis of the 3-axis tuner positioner, as shown in FIGS. 8, and 9.

Obvious alternative embodiments to the herein disclosed simple apparatus and method combining (a) low profile slide screw tuners, which use incorporated extension brackets for moving the tuning probes towards the DUT, (b) the method of mounting the tuners on probe stations for perfect alignment and direct, low loss, contact with the wafer probes maximizing this way the tuning range and (c) the method for planarity adjusting a wafer probe, are imaginable and possible, but shall not impede on the validity of the basic idea of the present invention.

What is claimed is:

1. A planarity control mechanism for RF wafer microprobes attached to load pull tuners comprising:
   a fixed attachment between the tuners and the RF wafer microprobes, and
   a rotational attachment of the tuner to a vertical axis of a three-axis positioner, and
   means for controlling a rotation of the tuners and the attached RF wafer microprobes, wherein
      the RF wafer microprobes have a body, probe tips and a coaxial connector; the tuners have a slabline with a center conductor linking a test and an idle port which are equipped with coaxial connectors,
   and wherein
      the fixed attachment between the tuners and the RF wafer microprobes allows the coaxial connector of the RF wafer microprobe and the coaxial connector of the tuner test port to be aligned, matched, and directly connected,
   and wherein
      the rotation axis through the tips of the RF wafer microprobes is different than the rotation axis through the coaxial connector of the RF wafer microprobe and the center conductor of the slabline;
   and wherein
      the rotational attachment of the tuner to the vertical axis of the three-axis positioner comprises a support block attached to the vertical axis of the three-axis positioner and a gimbal linking the tuner with the support block and allowing tilting the tuner versus the vertical axis of the three-axis positioner and rotating the tuner around the rotation axis of the tips of the RF wafer microprobes;
   and wherein
      the means for controlling the tilting and the rotation of the tuners comprise a handle including a knob and a shaft attached to the tuner and guided by a fork.

2. The planarity control mechanism for RF wafer microprobes of claim 1, wherein
   the support block of the attachment between the tuner and the three-axis positioner is rotationally attached to a base with an adjustable slope allowing aligning and directly connecting the coaxial connector of the tuner test port to the coaxial connector of the wafer probe.

* * * * *